United States Patent [19]
Dobkin et al.

[11] Patent Number: 5,926,358
[45] Date of Patent: *Jul. 20, 1999

[54] LEAD FRAME CAPACITOR AND CAPACITIVELY-COUPLED ISOLATOR CIRCUIT USING SAME

[75] Inventors: Robert C. Dobkin, Monte Sereno; Robert L. Reay, Mountain View, both of Calif.

[73] Assignee: Linear Technology Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/401,028

[22] Filed: Mar. 8, 1995

Related U.S. Application Data

[63] Continuation of application No. 07/985,881, Dec. 3, 1992, Pat. No. 5,444,600.

[51] Int. Cl.⁶ .................................................. H01G 4/01
[52] U.S. Cl. .................... 361/303; 361/306.2; 361/311; 29/25.42
[58] Field of Search .................... 361/301.3, 303, 361/305, 306.1, 306.2, 307, 311, 323, 329, 328, 330; 29/25.42; 427/79; 257/532, 534, 666, 724, 725

[56] References Cited

U.S. PATENT DOCUMENTS

| | | |
|---|---|---|
| 2,600,343 | 6/1952 | Tuttle . |
| 2,777,110 | 1/1957 | Kodama . |
| 2,885,601 | 5/1959 | Pesssel . |
| 2,896,028 | 7/1959 | Mackey . |
| 3,104,377 | 9/1963 | Alexander et al. . |
| 3,168,704 | 2/1965 | Gibbons . |
| 3,264,569 | 8/1966 | Lefferts . |
| 3,316,458 | 4/1967 | Jenny . |
| 3,437,943 | 4/1969 | Mader . |
| 3,489,952 | 1/1970 | Hinchey . |
| 3,537,022 | 10/1970 | Regan . |
| 3,593,208 | 7/1971 | Smith . |
| 3,614,832 | 10/1971 | Chance et al. . |
| 3,675,095 | 7/1972 | Lehmann . |
| 3,679,941 | 7/1972 | LaCombe et al. . |
| 3,745,508 | 7/1973 | Bruder et al. . |
| 3,757,175 | 9/1973 | Kim et al. . |
| 3,764,938 | 10/1973 | Barnes . |
| 3,833,838 | 9/1974 | Christiansen . |

(List continued on next page.)

FOREIGN PATENT DOCUMENTS

| | | |
|---|---|---|
| 1 197 561 | 7/1965 | Germany . |
| 2 114 940 | 3/1972 | Germany . |
| 2 723 363 | 11/1978 | Germany . |
| 39 15 998 A1 | 11/1990 | Germany . |
| 58-197962 | 11/1983 | Japan . |
| 58 197 862 | 2/1984 | Japan . |
| 62-108553 | 5/1987 | Japan . |
| 2-238655 | 9/1990 | Japan . |
| 2 294 061 | 2/1991 | Japan . |
| 3 078 248 | 6/1991 | Japan . |
| 4-44242 | 2/1992 | Japan . |
| 4-162657 | 6/1992 | Japan . |
| 1 048 485 | 10/1983 | Russian Federation . |
| 1 469 944 | 4/1977 | United Kingdom . |

*Primary Examiner*—Gregory Mills
*Attorney, Agent, or Firm*—Fish & Neave; Michael J. DeHaemer, Jr.; Mark D. Rowland

[57] ABSTRACT

A capacitor is provided including first and second electrodes formed from portions of the lead frame structure used in conventional integrated circuit packaging. The electrodes are encapsulated with dielectric molding material which provides dielectric insulation between the electrodes. A low power capacitively-coupled digital isolator circuit is also provided. The circuit employs a pair of the lead frame capacitors of the present invention and includes differential driver and receiver circuits. The receiver can also include an optional filter for increasing noise and glitch immunity.

20 Claims, 7 Drawing Sheets

U.S. PATENT DOCUMENTS

| | | |
|---|---|---|
| 4,023,053 | 5/1977 | Shimizu et al. . |
| 4,038,488 | 7/1977 | Lin . |
| 4,117,411 | 9/1978 | Goble . |
| 4,143,508 | 3/1979 | Ohno . |
| 4,167,647 | 9/1979 | Salera . |
| 4,173,033 | 10/1979 | Sako et al. . |
| 4,178,556 | 12/1979 | Attwood . |
| 4,188,651 | 2/1980 | Dornfeld et al. . |
| 4,193,028 | 3/1980 | Downs, II . |
| 4,249,135 | 2/1981 | Fisher et al. . |
| 4,292,595 | 9/1981 | Smith . |
| 4,376,274 | 3/1983 | Smart . |
| 4,391,531 | 7/1983 | Yokota et al. . |
| 4,410,905 | 10/1983 | Grabbe . |
| 4,506,108 | 3/1985 | Kersch et al. . |
| 4,536,638 | 8/1998 | Krynicki . |
| 4,551,747 | 11/1985 | Gilbert et al. . |
| 4,561,039 | 12/1985 | Tsukahara . |
| 4,600,907 | 7/1986 | Grellman et al. . |
| 4,622,619 | 11/1986 | Schilling et al. . |
| 4,680,613 | 7/1987 | Daniels et al. ............ 257/724 |
| 4,697,858 | 10/1987 | Balakrishanan . |
| 4,705,917 | 11/1987 | Gates, Jr. et al. . |
| 4,748,419 | 5/1988 | Somerville . |
| 4,780,795 | 10/1988 | Meinel . |
| 4,835,486 | 5/1989 | Somerville . |
| 4,974,054 | 11/1990 | Anjo . |
| 4,991,001 | 2/1991 | Takubo et al. . |
| 5,057,805 | 10/1991 | Kadowaki . |
| 5,229,640 | 7/1993 | Pak . |
| 5,233,220 | 8/1993 | Lamson et al. . |
| 5,302,921 | 4/1994 | Shigemori et al. . |
| 5,444,600 | 8/1995 | Dobkin et al. ............ 361/303 |

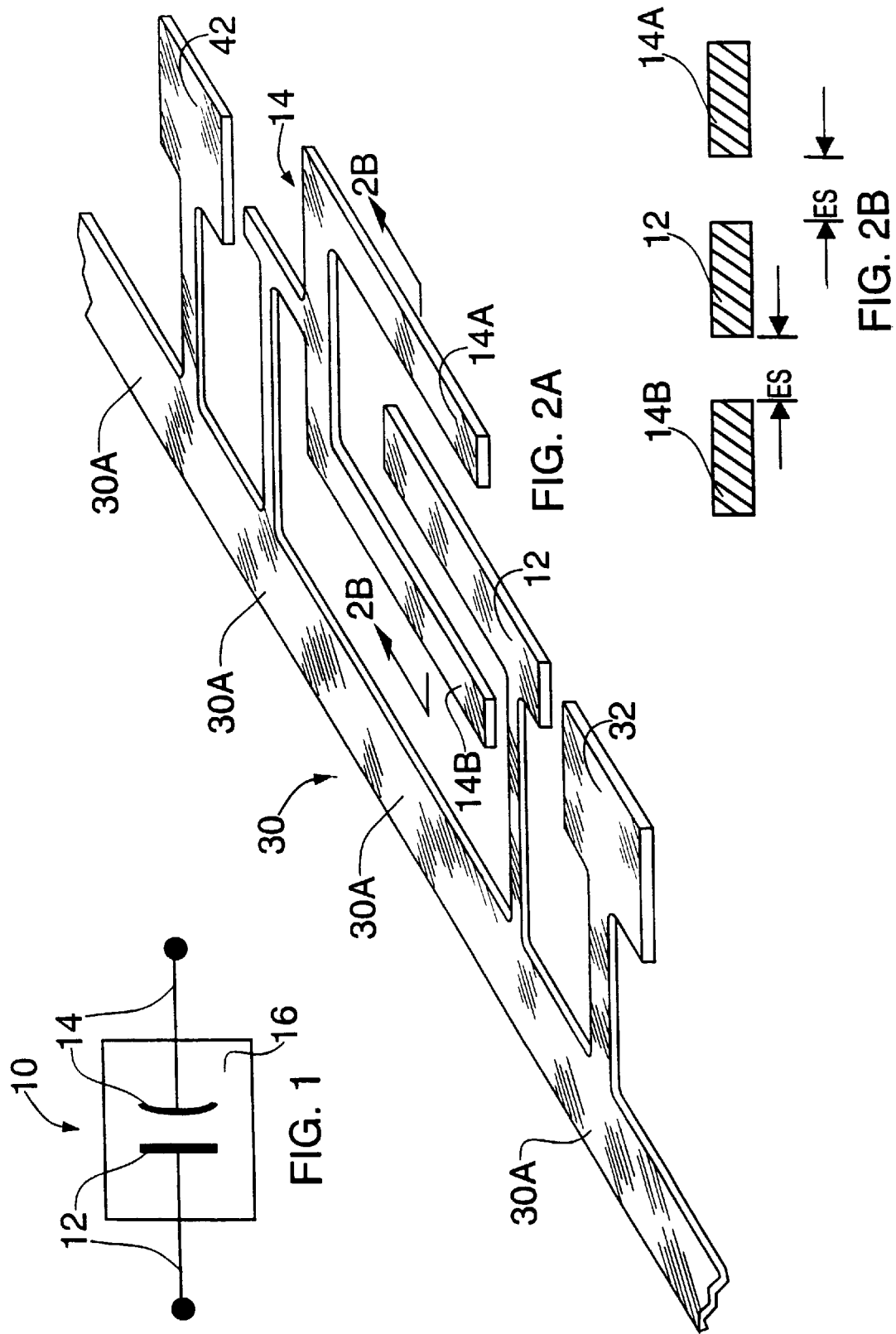

LEAD FRAME CAPACITOR AND CAPACITIVELY-COUPLED ISOLATOR CIRCUIT USING SAME

CROSS REFERENCE TO RELATED APPLICATION

This is a continuation of application Ser. No. 07/985,881, filed Dec. 3, 1992, now U.S. Pat. No. 5,444,600, entitled "Lead Frame Capacitor and Capacitively-Coupled Isolator Circuit Using Same."

BACKGROUND OF THE INVENTION

The present invention relates to a capacitor and a capacitively-coupled isolator circuit for providing ground reference potential isolation in an integrated circuit package.

Isolator circuits are used to couple signals between circuits having different ground reference potentials. In some situations, the respective grounds can have a difference in potential as high as several thousand volts. Generally, there are three methods for providing isolation between circuits having different ground reference potentials: opto-coupled isolation, transformer-coupled isolation, and capacitively-coupled isolation. Opto-coupled and transformer-coupled isolation techniques suffer the disadvantage that the coupling devices are relatively bulky and not well suited for use in an integrated circuit. Capacitors, on the other hand, can be made smaller and can be integrated on a semiconductor die.

However, attempts in the past to provide a capacitively-coupled isolator circuit on a single semiconductor die have been met with problems due to reliability constraints and damage from electrostatic discharging and overvoltage breakdown. In particular, it has been found to be difficult to provide silicon dioxide-based capacitors capable of withstanding the high voltage differentials commonly encountered in isolator circuits.

An alternative solution described in the prior art is to form isolation capacitors on a ceramic substrate disposed in a plastic encapsulated integrated circuit package between two semiconductor dies containing the input and output stages of the isolator circuit (see, e.g., Meinel U.S. Pat. No. 4,780,795). However, such a hybrid structure requires that the isolation capacitors be premanufactured on a separate substrate apart from the plastic package.

In view of the foregoing, it would be desirable to provide a capacitor that can withstand high voltage differentials and that can be implemented as an isolation capacitor in an integrated circuit package without an additional substrate.

It would also be desirable to provide an isolator circuit that can be fabricated in a single integrated package.

SUMMARY OF THE INVENTION

It is therefore an object of the present invention to provide a capacitor that can withstand high voltage differentials and that can be implemented as an isolation capacitor in an integrated circuit package without an additional substrate.

It is also an object of the present invention to provide an isolator circuit that can be fabricated in a single integrated package.

In accordance with these and other objects of the invention, there is provided a capacitor which includes electrodes formed from adapted portions of the lead frame structure used in conventional integrated circuit assembly and which makes use of conventional integrated circuit packaging material as the capacitor dielectric material.

There is also provided an isolator circuit wherein a pair of the above lead frame capacitors are used for providing isolation between two circuits at respective ground reference potentials. The isolator circuit is provided in a single integrated circuit package and can be fabricated using conventional integrated circuit assembly and packaging techniques.

In a preferred embodiment, the isolator circuit includes a low power digital isolator circuit having a transmitter capacitively-coupled to a differential receiver in a conventional integrated circuit package design. The digital isolator circuit can include an optional noise filter to prevent glitches at the output. Additionally, an external oscillator can be used to synchronize data output to an external clock.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which:

FIG. 1 is a schematic diagram providing a simplified illustration of a capacitor made in accordance with principles of the present invention;

FIG. 2A is a fragmentary perspective view of an embodiment of a lead frame for use in forming a lead frame capacitor in accordance with principles of the present invention;

FIG. 2B is a cross-sectional view of the lead frame of FIG. 2A, taken from line 2B—2B of FIG. 2A;

DETAILED DESCRIPTION OF THE INVENTION

FIG. 1 is a schematic diagram providing a simplified illustration of a capacitor 10 made in accordance with the present invention. Capacitor 10 includes electrodes 12 and 14 embedded and separated from each other by dielectric material 16. Electrodes 12 and 14 are formed from portions of a lead frame structure of the type used in conventional integrated circuit assembly. Dielectric material 16 is formed from molding material of the type used for encapsulation in conventional integrated circuit plastic packages. In a typical isolator circuit application, electrodes 12 and 14 would be electrically connected by conventional wire bonding to different integrated circuit dies operating at different ground reference potentials.

Figure 3:
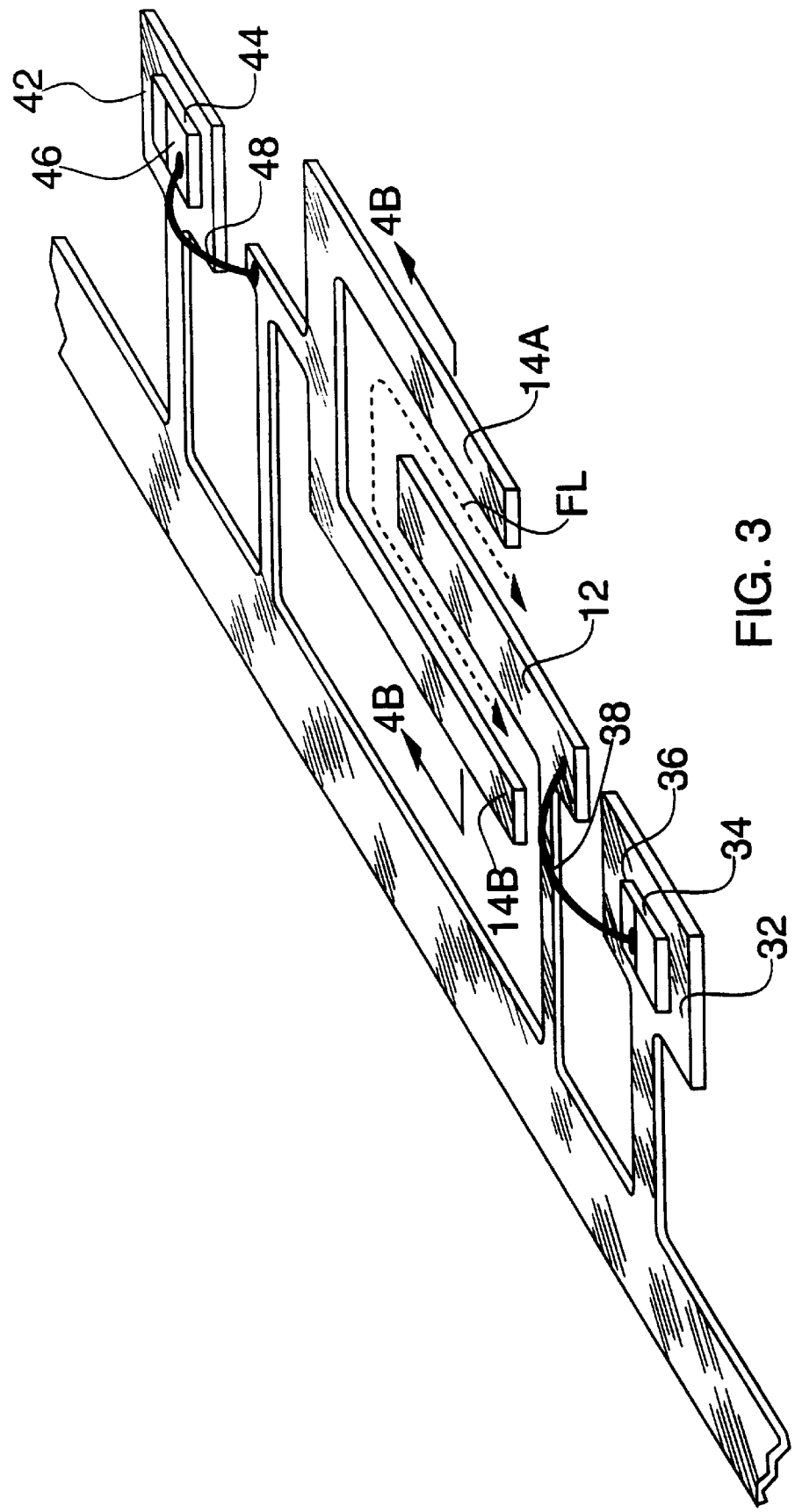
FIG. 3 is a perspective view of the lead frame of FIGS. 2A–B after semiconductor die attachment and wire bonding.
Figure 4:
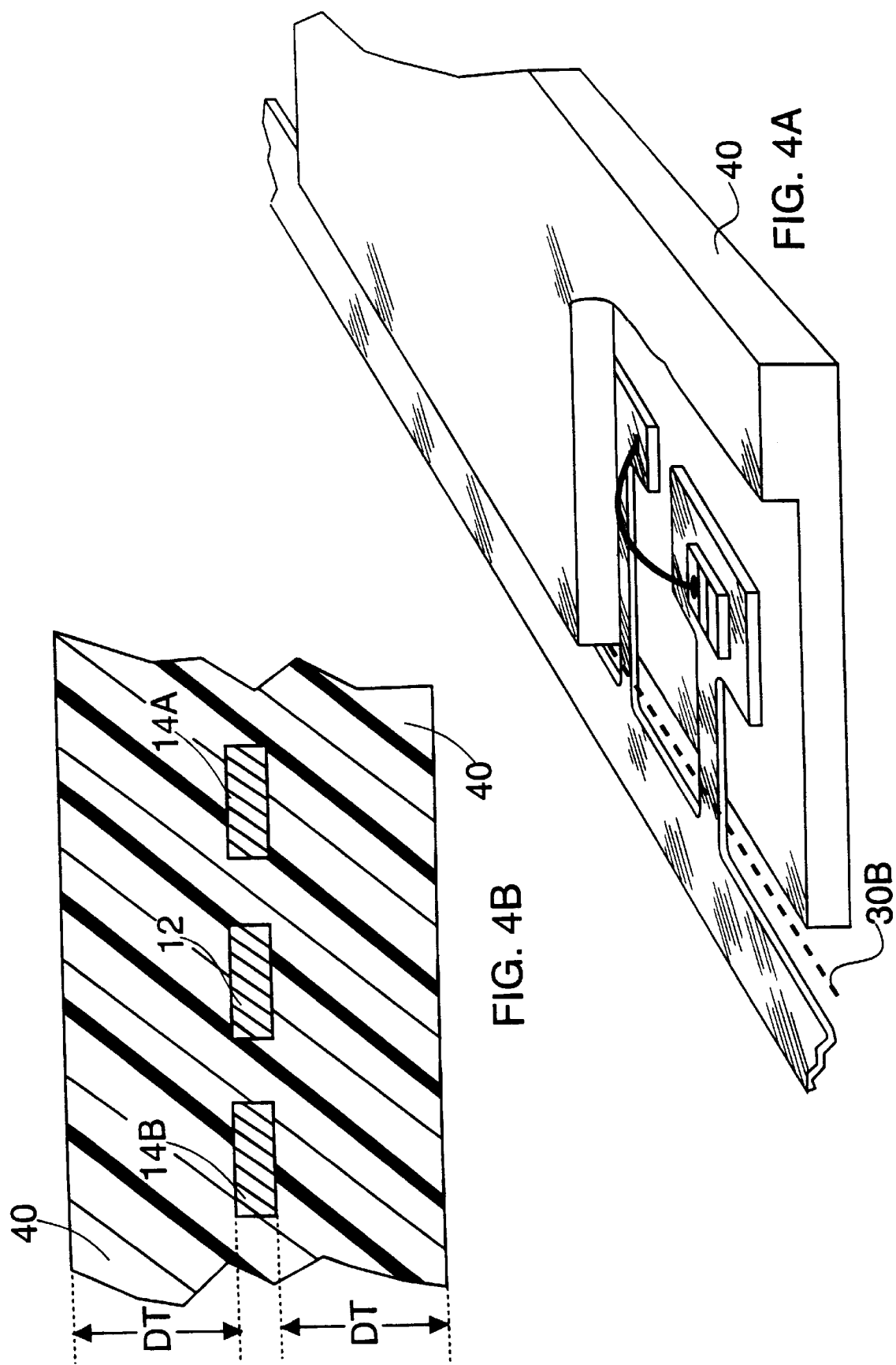
FIG. 4A is a fragmentary perspective view of the lead frame of FIG. 3 after encapsulation with dielectric molding material.
FIG. 4B is a cross-sectional view of the lead frame of FIG. 3, taken from line 4B—4B of FIG. 3, after encapsulation with dielectric molding material.

FIGS. 2–4 illustrate various aspects of an exemplary embodiment of capacitor 10. FIG. 2A is a fragmentary perspective view of a lead frame structure 30 configured to provide a capacitor in accordance with the present invention. As shown in FIG. 2A, lead frame structure 30 includes capacitor electrodes 12 and 14 and die attachment pads 32 and 42. Electrode 14 includes electrode fingers 14A and 14B, each of which is positioned to extend parallel to and on opposite sides of a single electrode finger of electrode 12. Portion 30A of lead frame structure 30 is a temporary support structure joining electrodes 12 and 14 and die attachment pads 32 and 42 during die attachment, wire bonding and encapsulation. Lead frame structure 30 can be adapted to provide electrodes 12 and 14 and die attachment pads 32 and 34 using conventional lead frame fabrication processes (e.g., stamping or etching).

Once encapsulated in plastic packaging material, electrodes 12 and 14 will form a coplanar and interdigitated capacitor wherein fringing electric fields provide the capacitance between electrode finger 12 and each of electrode fingers 14A and 14B. One of the factors which determines the capacitance of capacitor 10 is the distance between the electrodes. This distance is illustrated in FIG. 2B, which shows a cross-sectional view of lead frame structure 30 of FIG. 2A, taken from line 2B—2B of FIG. 2. As shown in FIG. 2B, lead frame electrode fingers 14A and 14B are separated from lead frame electrode 12 by an electrode separation distance of "ES". The distance "ES", along with other physical parameters relating to the size and shape of capacitor 10, are variables that can be easily controlled when fabricating lead frame structure 30 to achieve capacitors of different values and to meet the particular size constraints of conventional integrated circuit packages.

FIG. 3 is a perspective view of the lead frame structure 30 of FIGS. 2A and 2B after semiconductor die attachment and wire bonding. As shown in FIG. 3, semiconductor dies 34 and 44 are respectively attached to die attachment pads 32 and 42. In accordance with conventional integrated circuit packaging techniques, a silver-filed epoxy may be used to provide a conductive attachment between the dies and their respective attachment pads. Semiconductor dies 34 and 44 include respective bonding pads 36 and 46 coupled to circuitry (not shown) on the dies. Wire bonds 38,48 are used to make electrical connections between semiconductor dies 34,44 and lead frame electrodes 12,14, respectively. Thus, after encapsulation and removal of support 30A, semiconductor dies 34 and 44 will be capacitively coupled together through lead frame electrodes 12 and 14. As will be discussed below, also shown in FIG. 3 is the electrode fringe length "FL" (see dashed line labelled "FL") that substantially contributes to determining the value of the capacitance of the lead frame capacitor.

FIG. 4A is a fragmentary perspective view of lead frame structure 30 of FIG. 3 after encapsulation with a dielectric molding material 40 (e.g., by injection molding). FIG. 4B is cross-sectional view of the lead frame of FIG. 3, taken from line 4B–4B of FIG. 3, after encapsulation. In accordance with the present invention, and as shown in FIGS. 4A and 4B, electrodes 12 and 14 are fully encapsulated with dielectric molding material 40 which is used to provide dielectric insulation therebetween.

After encapsulation, lead frame support 30A is removed along dashed line 30B shown in FIG. 4A.

Thus, FIGS. 2–4 illustrate an embodiment of the lead frame capacitor of the present invention wherein the capacitor electrodes are coplanar and interdigitated. In this embodiment, the capacitor electrodes form what is commonly referred to as a "fringe capacitor" due to the fringing electric fields that provide the capacitance. It will be apparent to those of ordinary skill in the art that the capacitance value of capacitor 10 is determined substantially by the electrode separation distance "ES" (FIG. 2B), the electrode fringe length "FL" (FIG. 3) and the dielectric constant of dielectric molding material 40. (Assuming, of course, that the dielectric thickness "DT" [FIG. 4B] is significantly greater than the electrode separation distance "ES".) The electrode fringe length "FL" like the electrode separation distance "ES", can be easily controlled when fabricating lead frame structure 30 and can be varied as desired to achieve different capacitance values. As is well known, for example, increasing either the electrode fringe length "FL" or the dielectric constant of the dielectric molding material generally increases the value of the capacitance, whereas increasing the electrode separation distance "ES" generally decreases the value of the capacitance.

Using the electrode shapes illustrated in FIGS. 2–4, lead frame capacitance values ranging at least from approximately 0.1 picofarad to 2 picofarad should be readily achievable within a conventional eighteen lead molded plastic dual-in-line (DIP) package (e.g., a package approximately 23 mm long by 6 mm wide by 3 mm high). Of course, capacitor-electrode shapes other than those shown in FIGS. 2–4 also can be formed in accordance with the present invention.

The breakdown voltage of the lead frame capacitor of the present invention will be determined substantially by the electrode separation distance "ES" (FIG. 2B) and the dielectric properties of the dielectric molding material. For example, as the electrode separation distance increases, the breakdown voltage generally increases (although the lead frame capacitance accordingly decreases). Furthermore, as the breakdown strength of the dielectric molding material increases, the breakdown voltage of the capacitor also generally increases.

With conventional materials, the present invention can be used to achieve isolation voltages in excess of a thousand volts. For example, a common type of plastic molding material used in injection molded plastic packages is novalak epoxy. Novalak is a thermoplastic phenolformaldehyde-type resin. For an electrode separation distance of approximately 0.5 mm, a breakdown voltage in excess of 1000 volts can be obtained with this material.

Lead frame structure 30 can be made from a conventional lead frame material. For example, an iron-nickel-based alloy approximately 0.254 mm thick has been successfully used, although many other conducting materials and thickness could be used as well. Likewise, although the encapsulation material of the present invention can be a conventional molding material used in integrated circuit packaging (e.g., novalak epoxy having a dielectric constant of approximately 4), many other dielectric materials could be used as well. It is preferable that such dielectric materials have a high breakdown strength, high dielectric constant and low loss.

FIGS. 2–4 illustrate that in order to fabricate the lead frame capacitor of the present invention, the following steps are carried out. Capacitor electrodes are first patterned into a single sheet of lead frame material. Electrical connections between the capacitor electrodes and circuitry on one or more integrated circuit chips are then made by wire bonding. Lastly, the capacitor electrodes are encapsulated with dielectric molding material to provide dielectric insulation between electrodes.

A feature of the lead frame capacitor of the present invention is that each of the above steps are performed during the fabrication of conventional integrated circuits. Thus, the lead frame capacitor of the present invention can be provided in an integrated circuit at little or no additional cost and without added assembly or packaging complexity.

Figure 5:
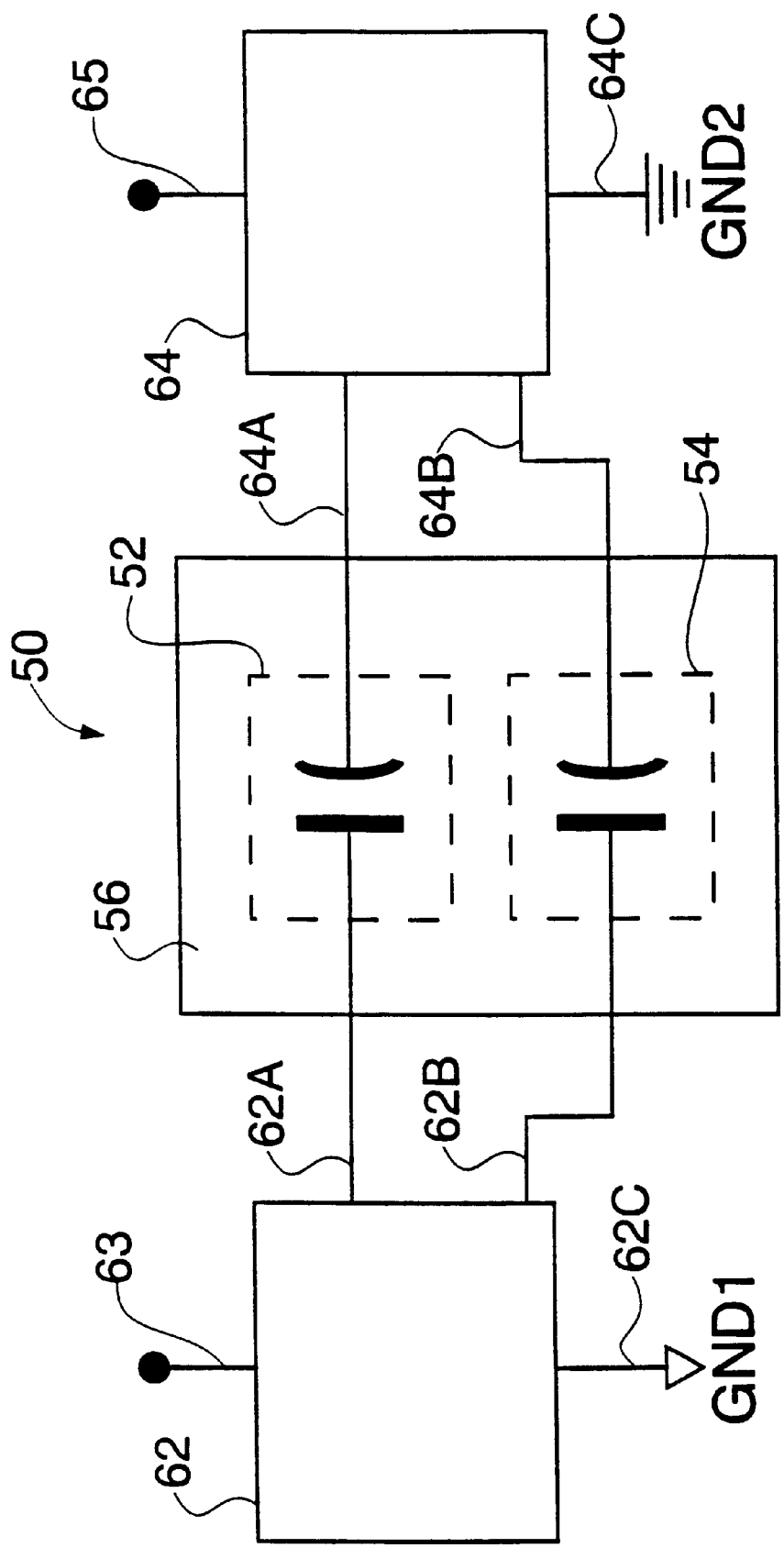
FIG. 5 is a schematic block diagram of an embodiment of an isolator circuit incorporating a pair of lead frame capacitors in accordance with principles of the present invention.

FIG. 5 is a schematic block diagram of an embodiment 50 of an isolator circuit incorporating a pair of the lead frame capacitors of the present invention. Isolator circuit 50 includes circuit 62 (having terminals 62A, 62B and 62C) and circuit 64 (having terminals 64A, 64B and 64C). Circuit 50 also includes lead frame capacitors 52 and 54 encapsulated with dielectric molding material 56. Terminals 62A and 64A are capacitively coupled together through lead-frame capacitor 52, while terminals 62B and 64B are capacitively coupled together through lead-frame capacitor 54. Terminals 62C and 64C are connected to respective ground reference potentials GND1 and GND2.

Circuits 62 and 64 may be of various types. For example, circuit 62 could be a driver circuit for generating electrical signals to be capacitively coupled across lead frame capacitors 52 and 54. Circuit 64 could be a receiver circuit for receiving such signals. A feature of the present embodiment is that GND1 of driver 62 could be at a different potential than GND2 of receiver 64. Thus, such a circuit could provide isolation between respective circuits.

As a second example, circuits 62 and 64 could each be a transceiver circuit for both transmitting an electrical signal across lead frame capacitors 52 and 54 and for receiving such signals. In accordance with this embodiment, GND1 of transceiver 62 could be at a different potential than GND2 of transceiver 64.

Circuits 62 and 64 shown in FIG. 5 also include terminals 63 and 65 for respectively coupling the circuit to other circuits (not shown). In accordance with the present invention, whether circuit 62 is a transmitter, transceiver or some other type of circuit, terminal 63 can accept an input signal (for example, supplied by a RS232 bus or a light-activated switch) that is subsequently encoded by circuit 62 to provide a serial bit stream that is coupled across capacitors 52 and 54 to circuit 64. Circuit 64 decodes the serial bit stream coupled across capacitors 52 and 54 to provide an output signal at terminal 65. In an alternative embodiment, terminal 63 can be replaced by a plurality of terminals for receiving parallel input signals. One or more of the parallel signal terminals can be used to provide operating power to circuit 62. Likewise, terminal 65 can be replaced by a plurality of terminals for providing parallel output signals.

Figure 6:
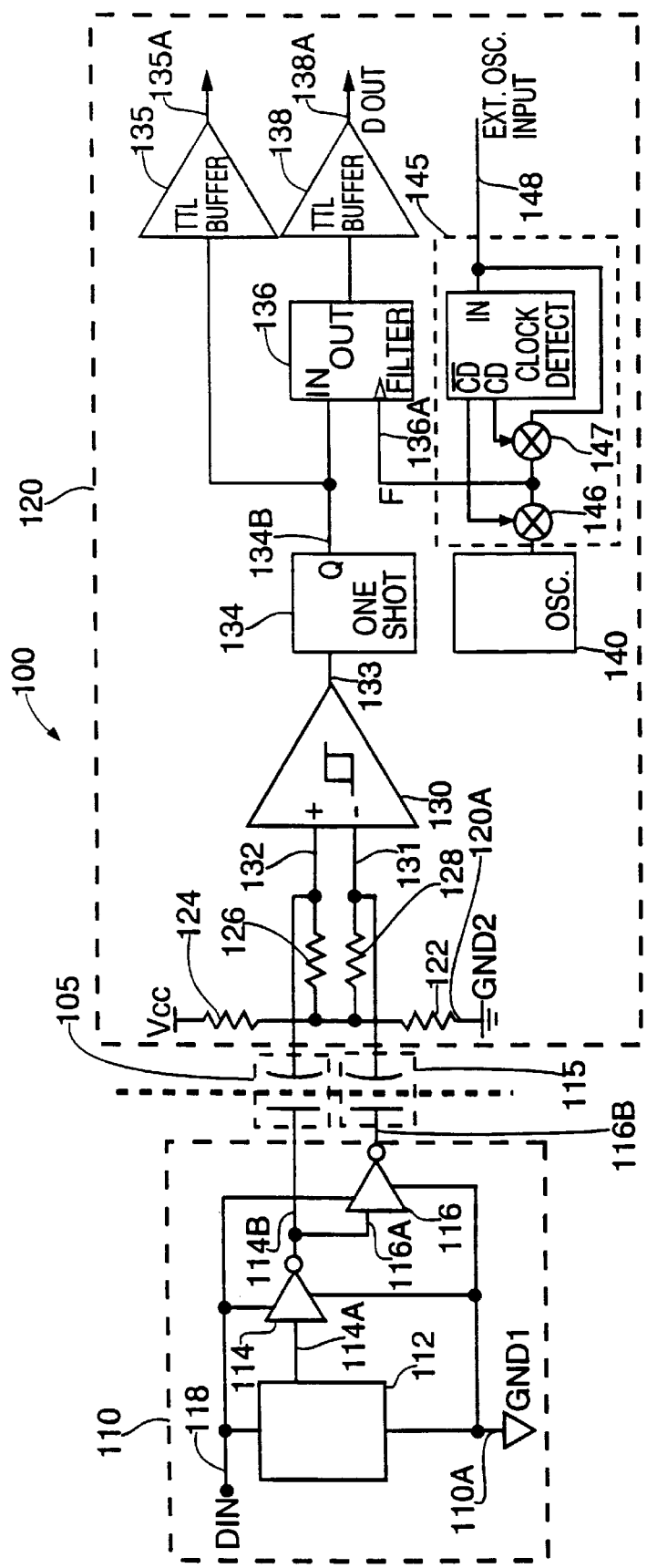
FIG. 6 is a detailed block diagram of a low power digital isolator circuit constructed in accordance with principles of the present invention.
Figure 7:
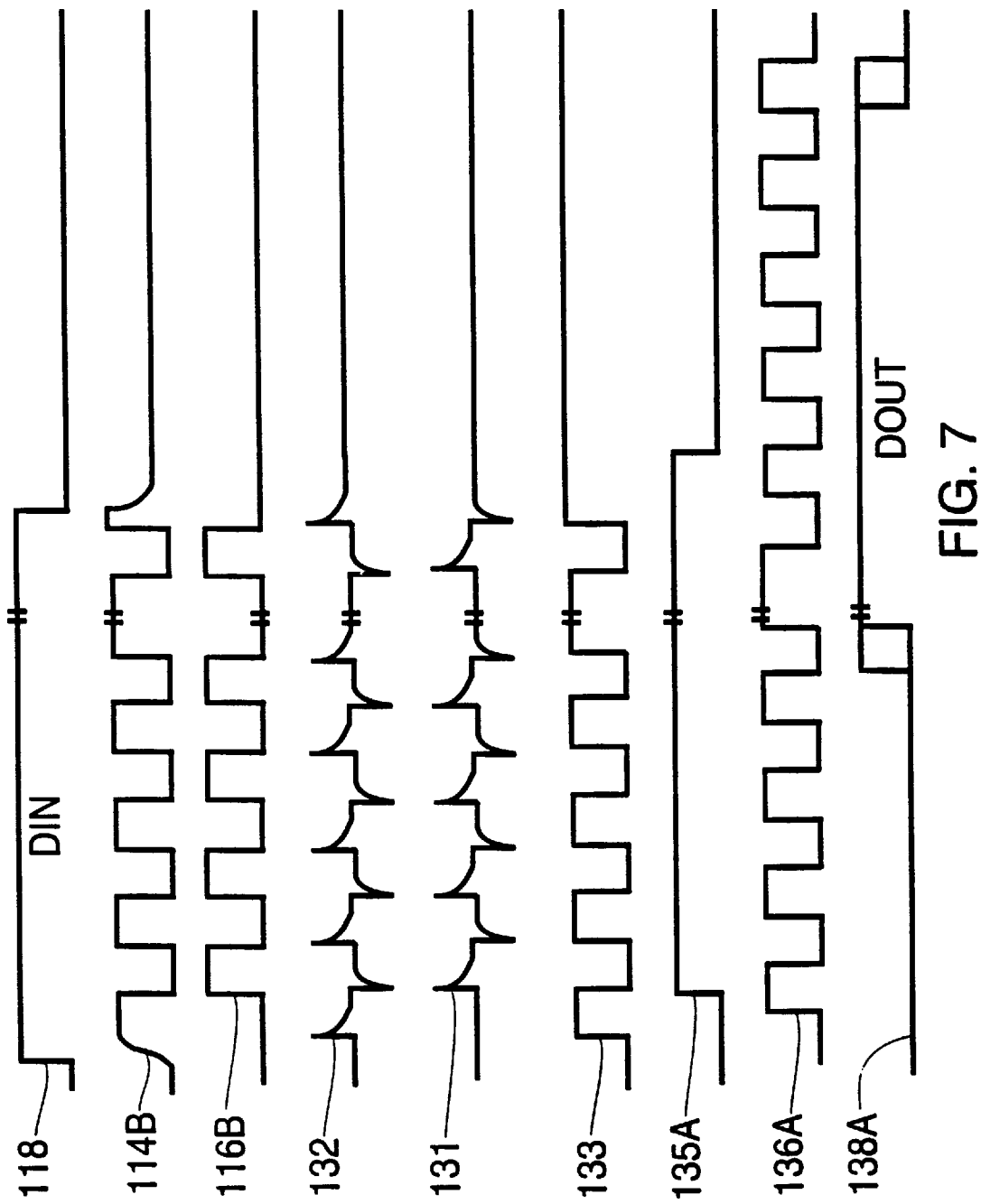
FIG. 7 illustrates the various signal waveforms for the digital isolator circuit of FIG. 6.

FIG. 6 provides a more detailed block diagram of an exemplary embodiment of a low power digital isolator circuit 100 constructed in accordance with the principles of the present invention and which utilizes a pair of the lead frame capacitors discussed above. FIG. 7 illustrates the various signal waveforms for the digital isolator circuit of FIG. 6.

In accordance with the present invention, isolator circuit 100 can be fabricated in a single integrated package utilizing manufacturing processes that are compatible with conventional integrated circuit manufacturing processes.

Isolator circuit 100 includes transmitter 110 capable of being powered from a single TTL digital input without the need for an additional source of input power. Transmitter 110 is referenced to ground GND1. Isolator circuit 100 also includes receiver 120, which provides a corresponding TTL digital output signal, that tracks the digital input signal, but is referenced to a ground of its own (GND2). Isolation is provided by a pair of lead frame capacitors (105 and 115) which share a common lead frame structure with transmitter 110 and receiver 120 in a single integrated circuit package. Isolation in excess of 1000 volts can be achieved at high bit rates and low power consumption levels. Isolator circuit 100 works as follows.

Transmitter 110 includes gated oscillator 112 and drivers 114 and 116. The supply current for gated oscillator 112 and drivers 114,116 are provided through digital input 118. When digital input (DIN) 118 exceeds a predetermined voltage (e.g., 3 volts), gated oscillator 112 turns on and provides a fixed-frequency square wave (at, for example, 4 MHz) to drivers 114 and 116 through driver inputs 114A and 116A, respectively. The outputs 114B and 116B of drivers 114 and 116 thus oscillate out of phase with each other at the same fixed frequency of gated oscillator 112. (See waveforms 118, 114B and 116B in FIG. 7, which illustrate the waveforms at terminals 118, 114B and 116 of FIG. 6, respectively.)

If desired, gated oscillator 112 may include a Schmitt trigger (not shown) to prevent the oscillator from driving capacitors 105 and 115 until input DIN rises to a sufficient level to provide a clean square wave output to drivers 114 and 116.

Drivers 114 and 116 couple the fixed-frequency square wave signal from gated oscillator 112 through lead frame capacitors 105 and 115 and form differential signals at inputs 131 and 132 of comparator 130. (See waveforms 131 and 132 in FIG. 7, which illustrate the waveforms at comparator inputs 131 and 132 in FIG. 6, respectively.) Comparator 130 is a hysteretic comparator so as to prevent a change in output state until inputs 131 and 132 are significantly different in voltage.

Comparator output 133 thus goes HIGH whenever output 114B of driver 114 goes HIGH while DIN is HIGH. Comparator output 133 therefore "tracks" output 114B of driver 114 while DIN is HIGH. (Compare waveform 114B to comparator output waveform 133 in FIG. 7.)

Comparator output 133 is used to drive input 134A of one-shot circuit 134. In response to comparator output 133 changing state, one-shot circuit output 134B, coupled through TTL buffer 135, goes HIGH. (See waveforms 133 and 135A in FIG. 7, which illustrate the waveforms at terminal 133 and 135A, respectively.) The time constant of one-shot circuit 134 is set to a predetermined multiple (e.g., two) of the period of oscillation of oscillator 112. As a result, output signal 135A will stay HIGH as long as the oscillation continues. When the digital input DIN goes LOW, gated oscillator 112 of transmitter 110 turns OFF and one-shot circuit output signal 135A resets LOW.

Thus, one-shot circuit output signal 135A substantially tracks digital input DIN independent of whether GND1 is at a same or different potential than GND2. This feature of the present invention is provided by lead frame capacitors 105 and 115 which supply an isolation barrier in isolator circuit 100.

To increase the noise and glitch immunity of isolator circuit 100, an optional filter 136 is preferably added to receiver circuit 120. Filter 136 is a binary counter clocked by either an internal free running oscillator 140 or an external oscillator (not shown) coupled to isolator circuit 100 through external oscillator input 148. Clock detector circuit 145 decouples internal oscillator 140 from filter 136 and couples the external oscillator (through switches 146 and 147, respectively) after detecting, for example, three consecutive pulses on external oscillator input 148. (Waveform 136A, shown in FIG. 7, illustrates the oscillation waveform at input 136A of filter 136.)

The frequency of internal oscillator 140 is preferably designed to match the frequency (although not synchronized) of gated oscillator 112 in transmitter 110. For digital output DOUT 138A (through TTL buffer 138) to go HIGH, filter 136 must count a predetermined number of consecutive clock cycles (for example, four) with one-shot circuit output 134B remaining HIGH. Similarly, for digital output DOUT 138A (through TTL buffer 138) to go LOW, filter 136 must also count a predetermined number of consecutive clock cycles (for example, four) with one-shot circuit output 134B remaining LOW. Waveform DOUT 138A, shown in FIG. 7, illustrates how data output 138A goes HIGH and returns LOW after four consecutive clock cycles. (The shaded areas in waveform DOUT 138A are due to oscillator 112 not being synchronized with oscillator input 136A of filter 136.)

If desired, an external oscillator coupled to external oscillator input 148 could be used to synchronize data output DOUT 138A to an external clock.

Thus, filter 136 provides enhanced noise and glitch immunity to isolator circuit 100. As an example of the enhanced noise and glitch immunity, assume that the digital input DIN 118 is LOW and gated oscillator 112 is OFF and there is a very large fast-rising common mode signal at ground GND1 110A and input DIN 118 (i.e., DIN is tied to GND1) with respect to ground GND2 120A of receiver 120. Any mismatch in lead-frame capacitors 105 and 115 will convert the common mode signal into a differential glitch at inputs 131 and 132 of comparator 130.

Output 133 of comparator 130 will accordingly toggle and output 134B of one-shot circuit 134 will go HIGH. However, filter 136 will only count one clock cycle (because the fast-rising common mode signal at GND1 and DIN is assumed to produce only one corresponding differential glitch at comparator 130) before the output of one-shot circuit 134 resets, so data output 138A will remain low. Filter 136 will function properly as long as the period of the common mode signal is greater than the one-shot period.

Figure 8:
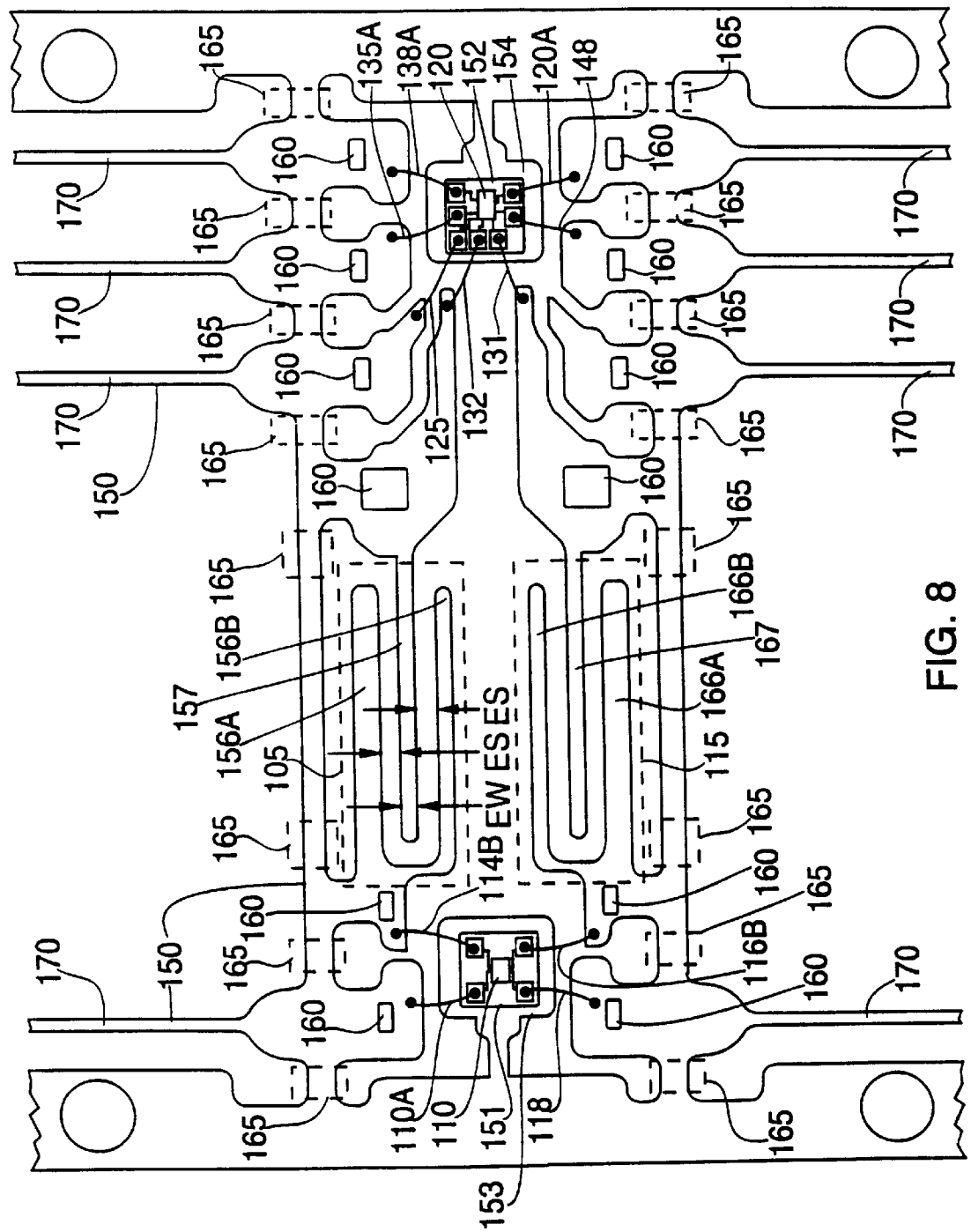
FIG. 8 is a plan view of an embodiment of a lead frame for the low power digital isolator circuit of FIG. 6.

An additional feature of the digital isolator circuit shown in FIG. 6 is that it can be manufactured using conventional integrated circuit processing and packaging technology. The lead-frame capacitors, which provide the circuit isolation, can be incorporated into the integrated circuit without a significant increase in manufacturing cost. FIG. 8 is a plan view of an embodiment of a preferred lead frame 150, after die attachment and wire bonding, for the low power digital isolator circuit of FIGS. 6 and 7.

Lead frame 150 has a size which corresponds to the size of the lead frame in a conventional eighteen lead dual-in-line (DIP) package (e.g., approximately 23 mm long by 6 mm wide), except that it has ten (five on each side) of its center leads replaced to provide area for the lead frame capacitors.

As shown in FIG. 8, transmitter 110 is manufactured on semiconductor die 151 which is attached to die pad 153 of lead frame 150. Similarly, receiver circuit 120 is manufactured on semiconductor die 152 which is attached to die pad 154 of lead frame 150. Lead frame 150 also includes interdigitated fingers 156A, 156B and 157, for forming lead-frame capacitor 105, and interdigitated fingers 166A, 166B and 167, for forming lead-frame capacitor 115.

Lead frame 150 also includes regions 165 which are removed after the complete isolator circuit is encapsulated with dielectric molding material so as to allow package pins 170 to be electrically isolated from each other. Locking holes 160 are included on lead frame 150 so as to allow the dielectric molding material to firmly hold package pins 170 in place during user handling.

Preferably, lead frame fingers 156A, 156B, 157, 166A, 166B and 167 have widths "EW" of approximately 0.5 mm and are spaced apart by spacings "ES" of approximately 0.5 mm. For the lead frame capacitor embodiment shown in FIG. 8, each capacitor 105 and 115 has a capacitance of approximately 1 picofarad using conventional dielectric molding material having a dielectric constant of approximately 4.

Thus, a capacitively-coupled digital isolator circuit has also been described. The circuit preferably uses low cost capacitors incorporated into the lead frame of a conventional integrated circuit package. Using conventional dielectric molding materials, the circuit can provide up to 1000 volts of isolation from input to output for TTL digital signals. Input currents as low as 60 and 600 microamps are achievable for embodiments which can handle frequencies of up to 20 and 200 kps, respectively.

One skilled in the art will thus appreciate that the present invention can be practiced by other than the described embodiments, which are presented for purposes of illustration and not of limitation, and the present invention is limited only by the claims which follow.

What is claimed is:

1. A lead frame capacitor for use in a packaged integrated circuit device, the lead frame capacitor comprising:

first and second ones of a plurality of spaced apart, non-overlapping portions of lead frame material separated by a region without a separate discrete capacitive element therebetween, wherein said first and second portions of lead frame material form first and second capacitor electrodes, respectively, and wherein a third one of said plurality of lead frame portions is adapted for mounting an integrated circuit die thereto; and a dielectric molding material disposed in said region, said dielectric molding material substantially encapsulating said first and second capacitor electrodes and providing dielectric insulation therebetween, to provide a substantially predetermined capacitance for the storage of electrical energy in an electric field generated by opposite charges on said first and second capacitor electrodes.

2. The lead frame capacitor of claim 1 wherein the first and second portions are substantially coplanar.

3. The lead frame capacitor of claim 2 wherein the first and second portions are interdigitated.

4. The lead frame capacitor of claim 3 wherein the first portion comprises a pair of first and second fingers and wherein said second portion comprises a third finger spaced between said first and second fingers.

5. The lead frame capacitor of claim 4 wherein the first and second portions are formed from a single sheet of lead frame material.

6. The lead frame capacitor of claim 5 wherein said dielectric molding material forms an integrated circuit package having two or more pins made from said single sheet of lead frame material.

7. A method for making a lead frame capacitor comprising the steps of:

(a) forming a sheet of lead frame material comprising first and second portions arranged to form first and second capacitor electrodes, respectively, for providing a substantially predetermined capacitance for the storage of electrical energy in an electric field generated by opposite charges on said portions, wherein said portions are separated by a region without a separate discrete capacitive element therebetween;

(b) attaching conductors to said first and second portions by which said portions are electrically connected in a circuit;

(c) providing dielectric molding material which substantially encapsulates said first and second capacitor electrodes and at least one of said conductors, wherein said dielectric material is disposed in said region as dielectric insulation between said first and second capacitor electrodes; and (d) removing lead frame material connecting said first and second portions to other portions of said sheet of lead frame material.

8. The method of claim 7 wherein the first and second portions are substantially coplanar.

9. The method of claim 8 wherein the first and second portions are interdigitated.

10. The method of claim 9 wherein the first portion comprises a pair of first and second fingers and wherein said second portion comprises a third finger spaced between said first and second fingers.

11. The method of claim 7, wherein the step of attaching conductors to said first and second portions comprises bonding wire to said first and second portions prior to substantially encapsulating said first and second portions with dielectric molding material.

12. The method of claim 11 wherein the step of providing dielectric molding material comprises substantially simultaneously encapsulating a semiconductor die with said dielectric molding material, wherein said semiconductor die is attached to a region of said sheet of lead frame material.

13. A lead frame capacitor in an integrated circuit package, comprising:

first and second capacitor electrodes separated by a region without a separate discrete substrate therebetween, wherein said first and second electrodes comprise substantially coplanar and interdigitated portions of lead frame material adapted to couple charge therebetween, said first and second electrodes being in the same plane as a die attachment pad comprising another portion of said lead frame material in said integrated circuit package; and a dielectric molding material disposed in said region, said dielectric molding material substantially encapsulating said first and second electrodes and providing dielectric insulation between said first and second electrodes.

14. The lead frame capacitor of claim 13 wherein the first electrode comprises a pair of first and second fingers and wherein said second electrode comprises a third finger spaced between said first and second fingers.

15. The lead frame capacitor of claim 14 wherein the first and second electrodes are formed from a single sheet of lead frame material.

16. The lead frame capacitor of claim 15 wherein said dielectric molding material forms an integrated circuit package having two or more pins made from said single sheet of lead frame material.

17. A method for making a lead frame capacitor in an integrated circuit package comprising the steps of:

(a) forming first and second electrodes and a die attachment pad in a sheet of lead frame material, wherein said electrodes are substantially coplanar, interdigitated, separated by a region without a separate discrete substrate, and adapted to couple charge therebetween; and (b) providing dielectric molding material to form said integrated circuit package including said capacitor and said die attachment pad, said dielectric molding material substantially encapsulating said first and second electrodes in said region as dielectric insulation between said first and second electrodes.

18. The method of claim 17 wherein the first electrode comprises a pair of first and second fingers and wherein said second electrode comprises a third finger spaced between said first and second fingers.

19. A method for making a lead frame capacitor comprising the steps of:

(a) forming first and second electrodes in a sheet of lead frame material, wherein said first electrode comprises a pair of first and second fingers and said second electrode comprises a third finger spaced between said first and second fingers so that said first and second electrodes are substantially coplanar, interdigitated, separated by a region without a separate discrete substrate, and adapted to couple charge therebetween:

(b) bonding wire to said electrodes; and (c) providing dielectric molding material in said region as dielectric insulation between said first and second electrodes, wherein said dielectric molding material substantially encapsulates said first and second electrodes.

20. The method of claim 19, wherein the step of providing dielectric molding material comprises substantially simultaneously encapsulating a semiconductor die with said dielectric molding material, wherein said semiconductor die is attached to a region of said sheet of lead frame material.

* * * * *